United States Patent
Nakagawa et al.

(10) Patent No.: US 6,856,028 B1
(45) Date of Patent: Feb. 15, 2005

(54) SEMICONDUCTOR DEVICE HAVING AN IMPROVED MOUNTING STRUCTURE

(75) Inventors: Kazuyuki Nakagawa, Tokyo (JP); Michitaka Kimura, Tokyo (JP); Masatoshi Yasunaga, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/665,415

(22) Filed: Sep. 20, 2000

(30) Foreign Application Priority Data

Mar. 22, 2000 (JP) ........................................ 2000-081026

(51) Int. Cl.[7] .......................... H01L 23/48; H01L 23/52; H01L 23/28; H01L 29/40
(52) U.S. Cl. ..................... 257/783; 257/780; 257/738; 257/778; 257/782; 257/784; 257/787; 257/701
(58) Field of Search ................................ 257/783, 782, 257/701, 778, 787, 784, 738, 780

(56) References Cited

U.S. PATENT DOCUMENTS

| | | | | |
|---|---|---|---|---|
| 5,976,912 A | * | 11/1999 | Fukutomi et al. ........... | 438/110 |
| 6,048,755 A | * | 4/2000 | Jiang et al. .................. | 438/118 |
| 6,049,129 A | * | 4/2000 | Yew et al. .................... | 257/737 |
| 6,111,306 A | * | 8/2000 | Kawahara et al. ........... | 257/666 |
| 6,144,102 A | * | 11/2000 | Amagai ........................ | 257/781 |
| 6,252,298 B1 | * | 6/2001 | Lee et al. ..................... | 257/668 |
| 6,429,372 B1 | * | 8/2002 | Taguchi et al. ............. | 174/52.4 |
| 6,455,354 B1 | * | 9/2002 | Jiang et al. .................. | 438/118 |

FOREIGN PATENT DOCUMENTS

| | | |
|---|---|---|
| JP | 1998-054344 | 9/1998 |
| TW | 328643 | 3/1998 |

* cited by examiner

*Primary Examiner*—Nitin Parekh
(74) *Attorney, Agent, or Firm*—McDermott Will & Emery LLP

(57) ABSTRACT

In a semiconductor device, a semiconductor element is bonded to an insulating circuit board. A resin layer for bonding the semiconductor element to the insulating circuit board is extended so as to become greater in size than the semiconductor element. Further, the surroundings of the semiconductor element are sealed with resin. Reliability of mounting is improved by alleviating stress developing in a solder joint of the external electrodes of the circuit board.

4 Claims, 3 Drawing Sheets

SEMICONDUCTOR DEVICE HAVING AN IMPROVED MOUNTING STRUCTURE

BACKGROUND OF THE INVENTION

1. Field of the Invention

The present invention relates to a semiconductor device in which a semiconductor element is mounted to an insulating circuit board, and more particularly, to a semiconductor device whose reliability of mounting is improved by means of improving a joint between a semiconductor element and an insulating circuit board, to thereby alleviate stress developing in a solder joint formed on each of external electrodes of the semiconductor device.

2. Background Art

FIG. 4 is a cross-sectional view showing a conventional semiconductor device in which a semiconductor element is mounted on the insulating circuit board.

As shown in FIG. 4, in the conventional semiconductor device, a semiconductor element 10 is mounted face-down on a circuit board 1 through use of an adhesive layer 5. An element electrode 11 is connected to a board electrode 4 provided on the lower surface of the circuit board 1 via an opening hole 2 formed therein and through use of a wire 12. The joint between the element electrode 11 and the board electrode 4 is sealed with resin 6. External electrodes 3 are provided on the lower surface of the circuit board 1. Each of the external electrodes 3 is fixedly mounted on the circuit board 1 via a solder joint 31 and on a module board 200 via a solder joint 32.

While the semiconductor element 10 is placed face-down on the insulating circuit board 1, the semiconductor element electrode 11 and a board electrode 4 provided on the lower surface of the insulating circuit board 1 are electrically interconnected by way of the opening hole 2 of the insulating circuit board 1. In the semiconductor device in which the joint between the semiconductor element electrode 11 and the board electrode 4 is sealed with resin, an adhesive layer 5 for bonding together the semiconductor element 10 and the insulating circuit board 1 is equal in size with the semiconductor element 10.

The semiconductor device 100 having such a configuration is fixedly mounted on the module board 200 via the external electrodes 3.

FIG. 5 is a cross-sectional view showing another conventional semiconductor device. The semiconductor device shown in FIG. 5 corresponds to the semiconductor device 100 shown in FIG. 4, in which the surrounding regions of the side surfaces of the semiconductor element 10 are additionally coated with sealing resin 7 so as to assume a flange structure. More specifically, the semiconductor device corresponds to the conventional semiconductor device shown in FIG. 4, in which the side surfaces of the semiconductor element 10 are sealed with resin so as to assume a flange structure.

In the conventional semiconductor devices shown in FIGS. 4 and 5, the resin of the adhesive layer 5 used for bonding the semiconductor element 10 to the insulating circuit board 1 is substantially equal in size with the semiconductor element 10. Stress due to a difference in thermal expansion coefficients of the constituent members of the semiconductor device 100 is exerted on the external electrodes 3 provided on the outermost periphery of the insulating circuit board 1, thereby resulting in a tendency toward a reduction in the reliability of packaging of the semiconductor device 100.

Further, there has recently been posed the task of prolonging the life of solder joints in a temperature cycle test, where a semiconductor device is mounted on a module board.

The present invention has been conceived to solve such a problem in the background art and is aimed at providing a semiconductor device which has improved joints between an insulating circuit board and a semiconductor element and improved reliability of mounting and which attains prolonged life of solder joints in a temperature cycle test to which the semiconductor device is subjected while being mounted on the module board.

SUMMARY OF THE INVENTION

According to one aspect of the present invention, a semiconductor device comprises a semiconductor element bonded to a circuit board. The semiconductor element has a primary surface and a back surface, and has an element electrode on the primary surface. The circuit board has a primary surface and a back surface, and has a board electrode on at least the back surface. The circuit board has a predetermined opening hole formed therein. The primary surface of the semiconductor element is bonded to the primary surface of the circuit board by means in of an adhesive layer which is greater in size than the primary surface of the semiconductor element, and the element electrode of the semiconductor element is connected to the board electrode provided on the back surface of the circuit board via the opening hole.

Other and further objects, features and advantages of the invention will appear more fully from the following description.

DETAILED DESCRIPTION OF THE PREFERRED EMBODIMENTS

Figure 1:
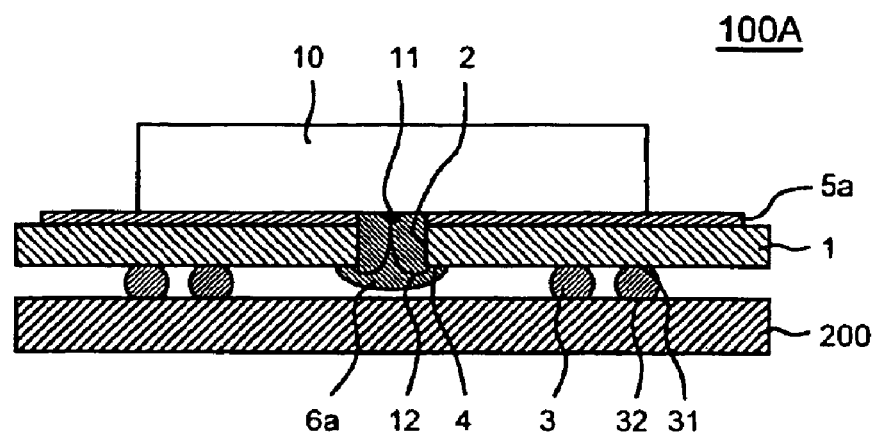
FIG. 1 is a cross-sectional view showing a semiconductor device according to a first embodiment of the present invention, in which a semiconductor element is placed face-down on an insulating circuit board, and the semiconductor device is mounted on a module board.

Preferred embodiments of the present invention will now be described by reference to the accompanying drawings. Throughout the drawings, like reference numerals designate like or corresponding elements, and repetition of their explanations is omitted here for brevity, as required.

First Embodiment

FIG. 1 is a cross-sectional view showing a semiconductor device according to a first embodiment of the present invention, in which a semiconductor element is placed face-down on an insulating circuit board, and the semiconductor device is mounted on a module board. In the first embodiment, an adhesive layer for bonding the semiconductor element to the insulating circuit board is greater in size than the semiconductor element.

In FIG. 1, reference numeral 1 designates an insulating circuit board for bonding a semiconductor element; 2 designates an opening hole formed in the insulating circuit board 1 for passage of an interconnection pattern; 3 designates an external electrode of the insulating circuit board 1; and 4 designates a board electrode (i.e., a lower-surface board electrode) provided on the lower surface of the insulating circuit board 1.

Reference numeral 10 designates a semiconductor element bonded face-down to the circuit board 1; 11 designates an element electrode of the semiconductor element 10; and 12 designates a wire for electrically connecting the element electrode 11 to the lower-surface board electrode 4.

Reference numeral 5a designates an adhesive layer which is formed so as to become larger than the semiconductor element 10 and fixedly bonds the semiconductor element 10 to the circuit board 1; and 6 designates sealing resin for sealing a portion of the semiconductor element 10 and the wire 12 which is exposed on the lower surface of the circuit board 1.

The opening hole 2 is formed in the insulating circuit board 1, and the semiconductor element 10 is bonded face-down to the insulating circuit board 1 by means of the adhesive layer 5a which extends so as to become larger than the semiconductor element 10. The semiconductor element electrode 11 is electrically connected to the lower-surface board electrode 4 via the opening hole 2 of the insulating circuit board 1.

Reference numeral 100A designates a semiconductor device having the foregoing configuration.

Reference numeral 200 designates a module board, and the semiconductor device 100 is mounted on the module board 200 via the external electrodes 3. The external electrodes 3 are formed from solder balls. The insulating circuit board 1 is bonded to each external electrode 3 via a solder joint 31, and the respective external electrode 3 is bonded to the module board 200 via a solder joint 32.

The semiconductor device 100A having such a structure is subjected to a temperature cycle test while being mounted on the module board 200. As a result, there are alleviated the stress imposed on the solder joint 31 between the respective external electrode 3 and the insulating circuit board 1 and the stress imposed on the solder joint 32 between the respective external electrode 3 and the module board 200.

Figure 4:
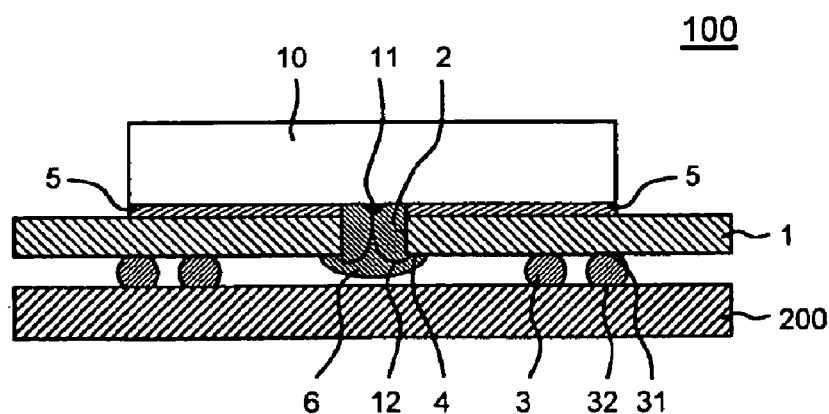
FIG. 4 is a cross-sectional view showing a conventional semiconductor device in which a semiconductor element is mounted on the insulating circuit board, and the semiconductor device is mounted on a module board.

This phenomenon can be explained as follows. In the conventional semiconductor device shown in FIG. 4, stress due to a difference between coefficients of thermal expansion of constituent members of the semicondutter device 100 is exerted on the external electrode 3 provided on the outermost periphery of the semiconductor device 100, thereby deteriorating the reliability of packaging of the semiconductor device 100. In contrast, in the structure of the semiconductor device 100A according to the present embodiment, the area covered by the adhesive layer 5a for absorbing the stress due to a difference in thermal expansion coefficients is greater than the semiconductor element 10. Accordingly, the stress exerted on the solder joints 31 and 32 is alleviated, thus improving the reliability of packaging of the semiconductor device 10A.

The structure of the semiconductor device according to the first embodiment may be summarized as follows. The circuit board 1 has a primary surface and a back surface, and the predetermined opening hole 2 is formed in the circuit board 1. The board electrode 4 is provided on at least the back surface of the circuit board 1. The semiconductor element 10 has a primary surface and a back surface, and the element electrode 11 is placed on the primary surface of the semiconductor element 10. The primary surface of the semiconductor element 10 is bonded to the primary surface of the circuit board 1 by means of the adhesive layer 5a, which is greater in size than the primary surface of the semiconductor element 10. The element electrode 11 of the semiconductor element 10 is connected to the board electrode 4 provided on the back surface of the circuit board 1, via the opening hole 2 formed therein.

More specifically, the adhesive layer 5a is greater in size than the semiconductor element 10 such that the entirety of the primary surface of the semiconductor element 10 is covered by the adhesive layer 5a and the adhesive layer 5a extends to the outside of the semiconductor element 10 to a predetermined distance.

Second Embodiment

Figure 2:
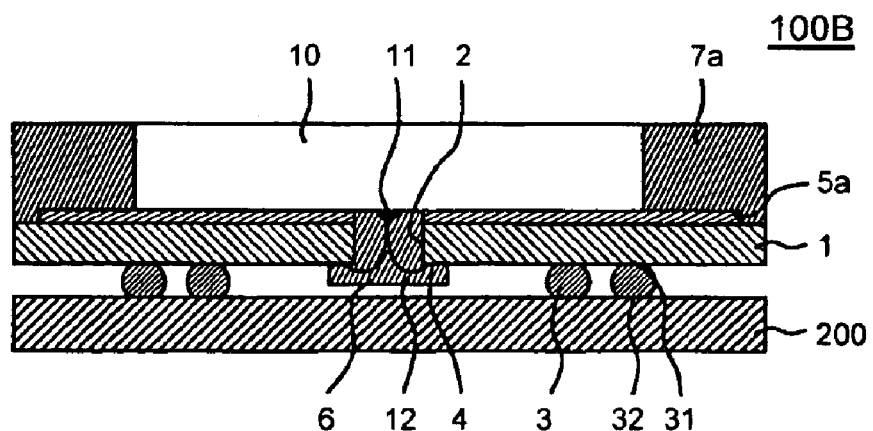
FIG. 2 is a cross-sectional view showing a semiconductor device according to a second embodiment of the present invention, in which a semiconductor element is bonded face-down to the insulating circuit board, and the semiconductor device is mounted on a module board.

FIG. 2 is a cross-sectional view showing a semiconductor device according to a second embodiment of the present invention, in which a semiconductor element is bonded face-down to the insulating circuit board, and the semiconductor device is mounted on a module board. In the second embodiment, the semiconductor device comprises the semiconductor element whose side surfaces are sealed with resin so as to assume a flange structure. Further, an adhesive layer for bonding the semiconductor element to the insulating circuit board is greater in size than the semiconductor element.

In FIG. 2, reference numeral 1 designates a circuit board; 2 designates an opening hole of the circuit board 1; 3 designates an external electrode of the circuit board 1; and 4 designates a lower-surface board electrode provided on the lower surface of the circuit board 1. Further, reference numeral 10 designates a semiconductor element; 11 designates an element electrode of the semiconductor element 10; and 12 designates a wire for electrically connecting the element electrode 11 to the lower-surface board electrode 4.

Reference numeral 5a designates an adhesive layer which is greater in size than the semiconductor element 10; and 6 designates sealing resin. Reference numeral 7a designates resin for sealing surrounding regions of the side surfaces of the semiconductor element 10 so as to assume a flange structure.

As mentioned above, the opening hole 2 is formed in the circuit board 1, and the semiconductor element 10 is bonded face-down to the circuit board 1 by means of the adhesive layer 5a which extends so as to become greater in size than the semiconductor element 10. The semiconductor element electrode 11 is electrically connected to the lower-surface board electrode 4 via the opening hole 2 of the circuit board 1. Surrounding regions of the side surfaces of the semiconductor element 10 are sealed with the resin 7a, to thereby assume a flange structure. Reference numeral 100B designates a semiconductor device having the foregoing structure.

Reference numeral 200 designates a module board, and the semiconductor device 100B is mounted on the module board 200 via the external electrodes 3. The external electrodes 3 are formed from solder balls. The insulating circuit board 1 is bonded to each external electrode 3 via a solder joint 31, and the respective external electrode 3 is bonded to the module board 200 via a solder joint 32.

The semiconductor device 100B having such a structure is subjected to a temperature cycle test while being mounted on the module board 200. As a result, there are alleviated the stress imposed on the solder joint 31 between the respective external electrode 3 and the insulating circuit board 1 and the stress imposed on the solder joint 32 between the respective external electrode 3 and the module board 200.

Figure 5:
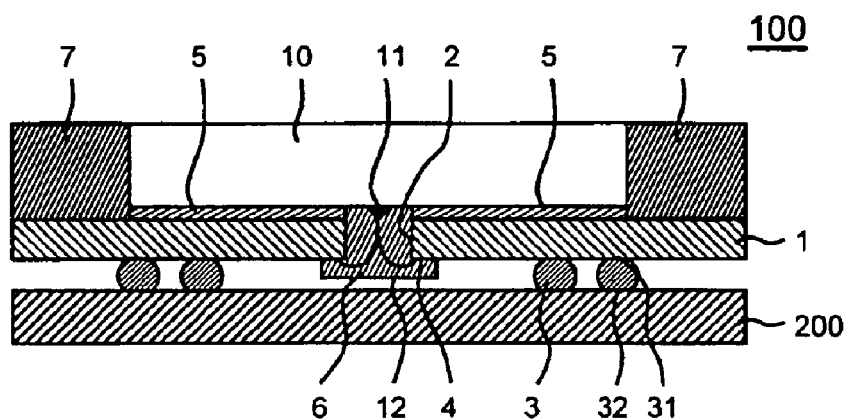
FIG. 5 is a cross-sectional view showing another conventional semiconductor device.

The reason for this is as follows. In the conventional semiconductor device shown in FIG. 5, the circuit board 1 becomes warped about a point in the vicinity of the edge of the semiconductor element 10, thereby shortening the life of solder joints of the semiconductor device 100. As shown in the present embodiment, since the adhesive layer 5a is made larger than the semiconductor element 10, the point about which the circuit board 1 is to warp is distant from the external electrodes 3 provided on the outermost periphery of the semiconductor device 100B. As a result, the stress exerted on the solder joints 31 and 32 of the respective external electrode 3 is alleviated, thereby improving the reliability of packaging of the semiconductor device 100B. As mentioned above, in the present embodiment, the rigidity and reliability of packaging of the semiconductor device 100B are improved.

Third Embodiment

Figure 3:
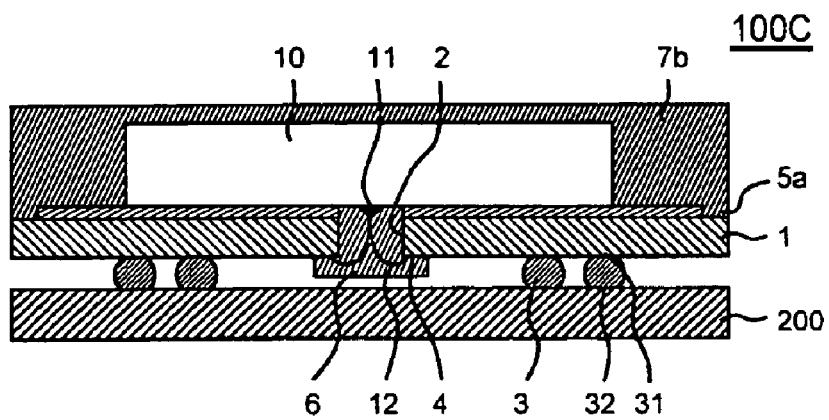
FIG. 3 is a cross-sectional view showing a semiconductor device according to a third embodiment of the present invention, in which a semiconductor element is bonded face-down to the insulating circuit boards and the semiconductor device is mounted on a module board.

FIG. 3 is a cross-sectional view showing a semiconductor device according to a third embodiment of the present invention, in which a semiconductor element is bonded face-down to the insulating circuit board, and the semiconductor device is mounted on a module board. In the third embodiment, the side surfaces and back surface of the semiconductor element are sealed with resin assuming a flange structure in the periphery. Further, an adhesive layer for bonding the semiconductor element to the insulating circuit board is larger in size than the semiconductor element.

In FIG. 3, reference numeral 1 designates a circuit board; 2 designates an opening hole formed in the circuit board 1; 3 designates an external electrode of the circuit board 1; and 4 designates lower-surface electrodes of the circuit board 1. Further, reference is numeral 10 designates a semiconductor element; 11 designates an element electrode of the semiconductor element 10; and 12 designates a wire for electrically connecting the element electrode 11 to the lower-surface board electrode 4.

Reference numeral 5a designates an adhesive layer which is larger in size than the semiconductor element 10 and bonds the semiconductor element 10 to the circuit board 1; and 6 designates sealing resin.

Reference numeral 7b designates resin for sealing surrounding regions of the side surfaces and back surface of the semiconductor element 10 (here the back surface corresponds to a surface opposite the surface of the semiconductor element 10 having the element electrode 11 mounted thereon), and the resin 7a assumes a flange structure in its periphery.

As mentioned above, in the present embodiment, the opening hole 2 is formed in the circuit board 1, and the semiconductor element 10 is bonded face-down to the circuit board 1 by means of the adhesive layer 5a which extends to the larger size than the semiconductor element 10. The semiconductor element electrode 11 is electrically connected to the lower-surface board electrode 4 via the opening hole 2 of the circuit board 1. Surrounding regions of the side surfaces and back surface of the semiconductor element 10 are sealed with the resin 7b, and thee portion of the resin 7b which seals surrounding regions of the side surfaces of the semiconductor element 10 assumes a flange structure. The sealing resin 7b corresponds to the sealing resin 7a of flange structure shown in FIG. 2, in a case where a resin layer of predetermined thickness is additionally and integrally formed from the sealing resin 7a onto the back surface of the semiconductor element 11. Reference numeral 100C designates a semiconductor device having the foregoing structure.

Reference numeral 200 designates a module board, and the semiconductor device 100C is mounted on the module board 200 via the external electrodes 3. The external electrodes 3 are formed from solder balls. The insulating circuit board 1 is bonded to each external electrode 3 via a solder joint 31, and the respective external electrode 3 is bonded to the module board 200 via a solder joint 32.

The semiconductor device 100C having such a structure is subjected to a temperature cycle test while being mounted on the module board 200. As a result, there are alleviated the stress imposed on the solder joint 31 between the respective external electrode 3 and the insulating circuit board 1 and the stress imposed on the solder joint-32 between the respective external electrode 3 and the module board 200.

The reason for this is as follows. In the conventional semiconductor device shown in FIG. 5, the circuit board 1 becomes warped about a point in the vicinity of the edge of the semiconductor element 10, thereby shortening the life of solder joints of the semiconductor device 100. In the case of the semiconductor device 100C according to the present embodiment, since the adhesive layer 5a is made so as to become larger in size than the semiconductor element 10, the point about which the circuit board 1 is to warp is distant from the external electrodes 3 provided on the outermost periphery of the semiconductor device 100C. As a result, the stress exerted on the solder joints 31 and 32 of the respective external electrode 3 is alleviated, thereby improving the reliability of packaging of the semiconductor device 100C.

Further, the sealing resin 7b assuming a flange structure is bonded to the circuit board 1 via the adhesive layer 5a having a high bonding characteristic. As a result, there can be prevented a decrease in the reliability of packaging of the semiconductor device 100C, which would otherwise be caused when the circuit board 1 is exfoliated from the sealing resin 7a assuming a flange structure. Further, the back surface of the semiconductor element 11 is protected by sealing resin, and hence handling of semiconductor devices during transportation becomes easy.

As mentioned above, in the present embodiment, the rigidity and reliability of packaging of the semiconductor device 100C are improved.

As has been described in the above embodiments, the present invention enables an improvement in the size of a resin layer for bonding the semiconductor element to the insulating circuit board, thereby alleviating stress which arises between the external electrodes and the module board and stress which arises between the external electrodes and the circuit board. Consequently, the reliability of packaging of the semiconductor device can be improved.

Further, the outer periphery of the semiconductor element of the semiconductor device is sealed with resin assuming a flange structure, whereby the semiconductor device assumes high rigidity. In such a semiconductor device, an improvement is made in the size of the resin layer for bonding the semiconductor element to the insulating circuit board, thereby enabling an improvement in the reliability of packaging of the semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-81026, filed on Mar. 22, 2000 including specification, claims, drawings and summary, on which the Convention priority of the present application is based, are incorporated herein by reference in its entirety.

What is claimed is:

1. A semiconductor device comprising:
   a semiconductor element having a primary surface and a back surface, said semiconductor element having an element electrode on the primary surface; and
   a circuit board having a primary surface and a back surface, a board electrode on at least the back surface, a predetermined opening hole formed therein and external electrodes disposed on the back surface;
   wherein the primary surface of said-semiconductor element is bonded to the primary surface of said circuit board by means of an adhesive layer which is greater in size than the primary surface of said semiconductor element,
   said adhesive layer extends outside an outer edge of the primary surface of said semiconductor element without reaching an outer edge of the primary surface of said circuit board, said adhesive layer extending outward relative to and completely all the way around the primary surface of said semiconductor element to cover an area of the circuit board under which all the external electrodes are disposed,
   said element electrode of said semiconductor element is connected to said board electrode provided on the back surface of said circuit board via said opening hole, and
   said semiconductor element and said circuit board directly contact each other via the adhesive layer in order to relieve tension between said semiconductor element and said circuit board by the adhesive layer.

2. The semiconductor device as according to claim 1, wherein the surrounding regions of the side surfaces of said semiconductor element on said circuit board are sealed with resin so as to assume a flange structure.

3. The semiconductor device as according to claim 1, wherein the surrounding regions of the side surfaces and back surface of said semiconductor element are sealed with resins.

4. A semiconductor device comprising:
   a semiconductor element having a primary surface and a back surface, said semiconductor element having an element electrode on the primary surface; and
   a circuit board having a primary surface and a back surface, a board electrode on at least the back surface, a predetermined opening hole formed therein and external electrodes disposed on the back surface;
   an adhesive layer bonding the primary surface of said semiconductor element to the primary surface of said circuit board so that said semiconductor element and said circuit board directly contact each other via the adhesive layer,
   wherein said element electrode of said semiconductor element is connected to said board electrode provided on the back surface of said circuit board via said opening hole,
   said adhesive layer extends outward relative to and completely all the way around the primary surface of said semiconductor element without reaching an outer edge of the primary surface of said circuit board, and covers an area of the circuit board under which all the external electrodes are disposed.

* * * * *